United States Patent
Lee et al.

(10) Patent No.: US 12,014,768 B2
(45) Date of Patent: Jun. 18, 2024

(54) DRAM COMPUTATION CIRCUIT AND METHOD

(71) Applicant: TAIWAN SEMICONDUCTOR MANUFACTURING COMPANY, LTD., Hsinchu (TW)

(72) Inventors: Chieh Lee, Hsinchu (TW); Chia-En Huang, Hsinchu (TW); Yi-Ching Liu, Hsinchu (TW); Wen-Chang Cheng, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 60 days.

(21) Appl. No.: 17/589,729

(22) Filed: Jan. 31, 2022

(65) Prior Publication Data
US 2023/0030605 A1    Feb. 2, 2023

Related U.S. Application Data

(60) Provisional application No. 63/226,902, filed on Jul. 29, 2021.

(51) Int. Cl.
*G11C 11/4091*    (2006.01)
*G11C 5/06*    (2006.01)
(Continued)

(52) U.S. Cl.
CPC .......... *G11C 11/4091* (2013.01); *G11C 5/063* (2013.01); *G11C 11/4094* (2013.01); *G11C 11/4096* (2013.01); *H03K 19/20* (2013.01)

(58) Field of Classification Search
CPC . G11C 11/4091; G11C 5/063; G11C 11/4094; G11C 11/4096; G11C 7/1006;
(Continued)

(56) References Cited

U.S. PATENT DOCUMENTS 5,457,696 A * 10/1995 Mori ............ G11C 29/34
                                                                 365/201
9,851,915 B2 * 12/2017 Chen ............ G06F 3/0644
(Continued)

FOREIGN PATENT DOCUMENTS

CN    115376580 A * 11/2022 ......... G11C 11/4091
TW    202044127     12/2020
(Continued)

OTHER PUBLICATIONS

He, Mingxuan et al., "Newton: A DRAM-maker's Accelerator-in-Memory (AiM) Architecture for Machine Learning", 2020 53rd Annual IEEE/ACM International Symposium on Microarchitecture (MICRO), pp. 372-385.
(Continued)

*Primary Examiner* — Fernando Hidalgo
(74) *Attorney, Agent, or Firm* — Hauptman Ham, LLP

(57) ABSTRACT

A memory circuit includes first and second circuits. The first circuit includes a DRAM array including a plurality of bit lines, and the second circuit includes a computation circuit including a sense amplifier circuit. A boundary layer is positioned between the first and second circuits, and the boundary layer includes a plurality of via structures configured to electrically connect the plurality of bit lines to the sense amplifier circuit.

20 Claims, 8 Drawing Sheets

(51) Int. Cl.
  *G11C 11/4094*  (2006.01)
  *G11C 11/4096*  (2006.01)
  *H03K 19/20*  (2006.01)

(58) Field of Classification Search
  CPC ....... G11C 7/18; G11C 11/4097; G11C 11/54;
       G11C 11/4063; G11C 7/16; H03K 19/20;
       G06N 3/063; H01L 21/76898; H01L
           23/481; H10B 12/482
  USPC ..................................................... 365/185.21
  See application file for complete search history.

(56) References Cited

U.S. PATENT DOCUMENTS

| | | | |
|---|---|---|---|
| 2009/0207642 A1 | 8/2009 | Shimano et al. | |
| 2019/0042199 A1 | 2/2019 | Sumbul et al. | |
| 2022/0020421 A1* | 1/2022 | Kadowaki | G11C 11/4091 |
| 2022/0310620 A1* | 9/2022 | Kanago | G11C 29/50004 |
| 2023/0025248 A1* | 1/2023 | Son | H10B 43/40 |

FOREIGN PATENT DOCUMENTS

| | | |
|---|---|---|
| TW | 202121259 | 6/2021 |
| WO | 2020159800 | 8/2020 |

OTHER PUBLICATIONS

Jiang, li, et al., "Modeling TSV Open Defects in 3D-Stacked DRAM", International Test Conference, 2010 IEEE, pp. 1-9.

* cited by examiner

DRAM COMPUTATION CIRCUIT AND METHOD

PRIORITY CLAIM

The present application claims the priority of U.S. Provisional Application No. 63/226,902, filed Jul. 29, 2021, which is incorporated herein by reference in its entirety.

BACKGROUND

Memory arrays are often used to store and access data used for various types of computations such as logic or mathematical operations. To perform these operations, data bits are moved between the memory arrays and circuits used to perform the computations. In some cases, computations include multiple layers of operations, and the results of a first operation are used as input data in a second operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
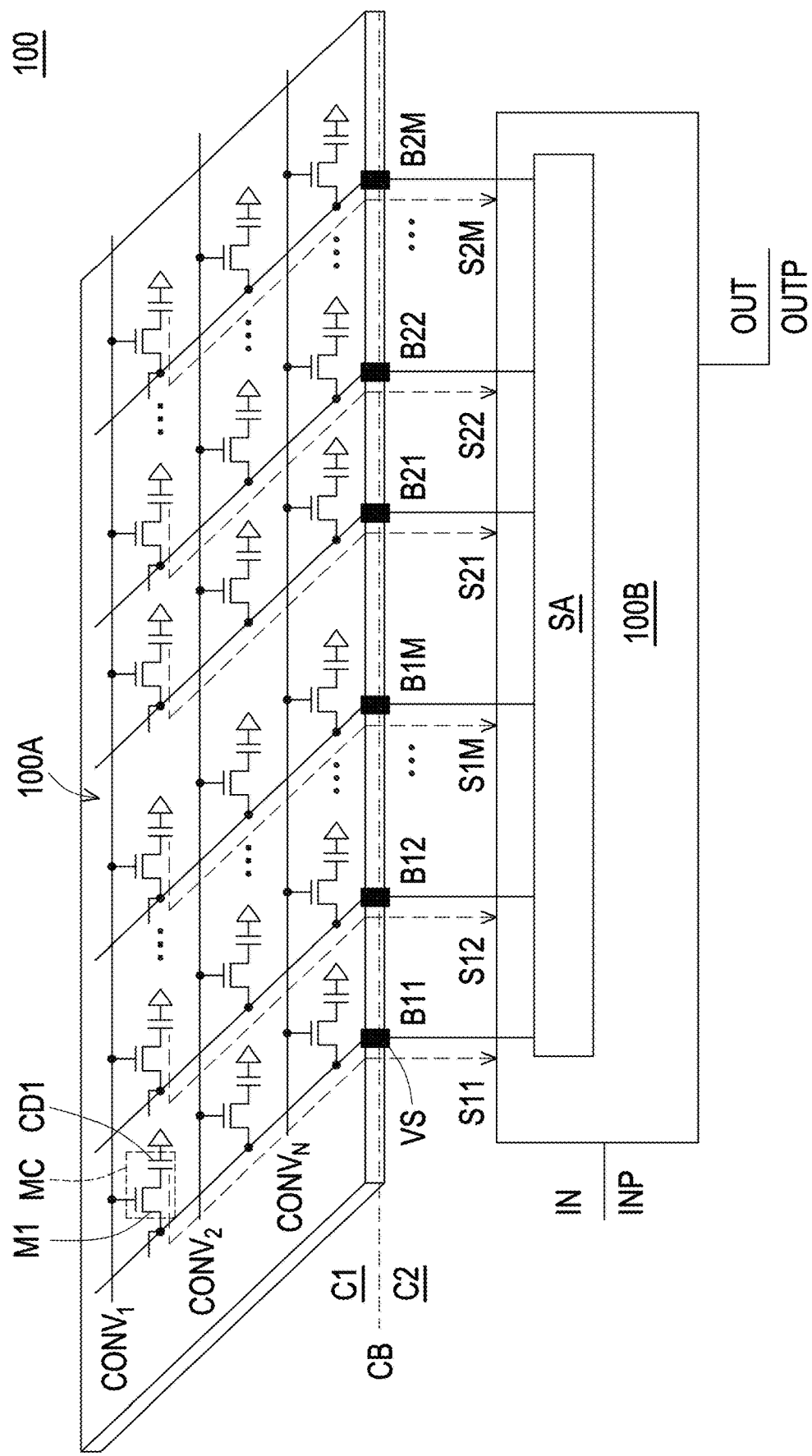
FIGS. 1A-1F are diagrams of memory circuits, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a dynamic random-access memory (DRAM) array of a memory circuit is positioned in a first circuit, a computation circuit including a sense amplifier is positioned in a second circuit separated from the first circuit by a circuit boundary, and bit lines of the memory circuit include via structures positioned in the circuit boundary. The various embodiments are thereby configured to be capable of performing computation-in-memory (CIM) operations based on weight data elements stored in the DRAM array. Compared to other approaches, such memory circuits are capable of performing CIM operations based on high memory capacity using a smaller area and lower power level. In various applications, e.g., convolutional neural network (CNN) applications, the memory circuit embodiments enable the weight data elements to be efficiently applied to sets of input data elements in multiply-and-accumulate (MAC) and other operations.

Figure 1B:
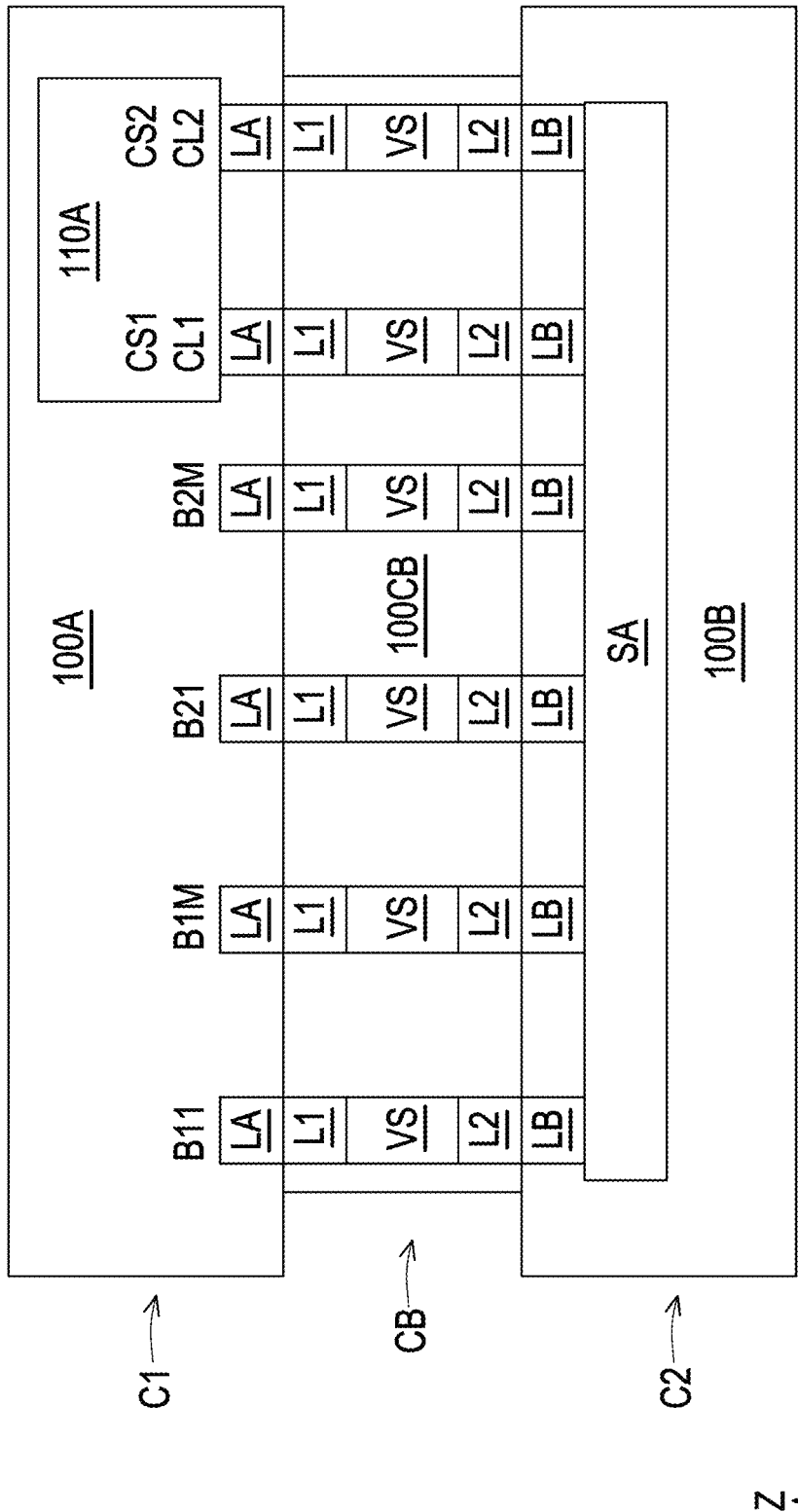

FIGS. 1A and 1B are diagrams of a memory circuit 100, in accordance with some embodiments. FIG. 1A is a schematic representation of circuit 100 and FIG. 1B depicts a non-limiting example of a cross-sectional arrangement of memory circuit 100 including an X direction and a Z direction. FIGS. 1C-1F discussed below depict non-limiting examples of a portion of memory circuit 100 including the X direction and a Y direction.

Memory circuit 100 includes a DRAM array 100A positioned in a circuit C1 and a computation circuit 100B including a sense amplifier SA, also referred to as sense amplifier circuit SA in some embodiments, and positioned in a circuit C2. Circuit C2 is separated from circuit C1 by a boundary layer CB, also referred to as a circuit boundary CB in some embodiments. Each of circuits C1 and C2 and boundary layer CB has dimensions in two directions, e.g., the X and Y directions, substantially greater than a dimension in a third direction perpendicular to the first two directions, e.g., the Z direction, and boundary layer CB substantially overlaps each of circuits C1 and C2 along the third direction. In some embodiments, circuits C1 and C2 are referred to as integrated circuit (IC) device layers C1 and C2, respectively.

Bit lines B11-B1M and B21-B2M are conductive paths that extend from DRAM array 100A to sense amplifier SA of computation circuit 100B and include corresponding instances of via structures VS (a single instance labeled in FIG. 1A for clarity) positioned in one or more structural layers 100CB of boundary layer CB. In the embodiment depicted in FIG. 1B, DRAM array 100A includes a control circuit 110A, and memory circuit 100 includes control lines CL1 and CL2, conductive paths that extend from control circuit 110A to sense amplifier SA. Each of control lines CL1 and CL2 includes an instance of via structure VS positioned in one or more structural layers 100CB.

In the embodiment depicted in FIGS. 1A and 1B, circuit C1 is positioned above circuit C2 in the Z direction, and boundary layer CB is adjacent to each of circuits C1 and C2. In some embodiments, circuit C2 is positioned above circuit C1 in the Z direction and/or boundary layer CB is adjacent to a single one or neither of circuits C1 or C2, e.g., separated from one or both of circuits C1 or C2 by one or more additional layers (not shown).

In the embodiment depicted in FIG. 1B, in addition to an instance of via structure VS, each of bit lines B11-B1M and B21-B2M and control lines CL1 and CL2 includes a conductive path LA in DRAM 100A, a conductive path L1 in boundary layer CB between conductive path LA and the instance of via structure VS, a conductive path LB in computation circuit 100B, and a conductive path L2 in boundary layer CB between conductive path LB and the instance of via structure VS. In some embodiments, one or more of bit lines B11-B1M or B21-B2M or control lines CL1 or CL2 does not include one or both of conductive paths L1 or L2, e.g., by including an instance of via structure VS directly connected to one or both of conductive paths LA or LB.

Each of conductive paths LA and LB is a metal interconnect structure including one or more metal lines and/or via structures positioned within the corresponding circuit C1 or C2. Each conductive path LA is configured to provide an electrical connection between one or more elements of DRAM 100A and the corresponding conductive path L1 or via structure VS, and each conductive path LB is configured to provide an electrical connection between one or more elements of computation circuit 100B, e.g., sense amplifier SA, and the corresponding conductive path L2 or via structure VS. In some embodiments, lowermost portions of conductive paths LA are positioned along a first X-Y plane at which DRAM 100A is adjacent to boundary layer CB, and uppermost portions of conductive paths LB are positioned along a second X-Y plane, below the first X-Y plane, at which computation circuit 100B is adjacent to boundary layer CB.

In the embodiment depicted in FIG. 1B, each of bit lines B11-B1M and B21-B2M and control lines CL1 and CL2 corresponds to a single instance of each of via structure VS and conductive paths LA, L1, L2, and LB. In some embodiments, a given one of bit lines B11-B1M or B21-B2M or control lines CL1 or CL2 corresponds to multiple instances of one or more of via structure VS or conductive paths LA, L1, L2, or LB. In some embodiments, a given one or more of via structure VS or conductive paths LA, L1, L2, or LB corresponds to multiple instances of bit lines B11-B1M or B21-B2M or control lines CL1 or CL2, e.g., embodiments in which multiple bit lines share an input to sense amplifier SA or embodiments in which a control line CL1 or CL2 includes multiple connections to sense amplifier SA.

In some embodiments, circuits C1 and C2 are IC device layers of an IC device package, e.g., a 3D IC package, and the one or more structural layers 100CB include elements configured to maintain a combination of a mechanical arrangement and electrical connections between IC devices of the IC device package. In some embodiments, each of circuits C1 and C2 includes some or all of a semiconductor wafer or die, e.g., in a wafer-on-wafer, die-on-wafer, or die-on-die arrangement. In some such embodiments, via structures VS include one or more chip bonding elements including one or more metal materials, e.g., solder balls or copper or other metal pillars or studs, and, if present, one or both of conductive paths L1 or L2 includes a pad or other similar structure positioned on or connected to the one or more semiconductor wafers or dies, via structure VS and conductive paths L1 and/or L2 thereby being suitable for providing electrical and/or mechanical connections between multiple semiconductor wafers and/or dies. In some embodiments, one or both of conductive paths L1 or L2 include one or more elements of one or more redistribution layers of an IC device package.

In some embodiments, the one or more structural layers 100CB of boundary layer CB include one or more dielectric layers of an IC device package, the one or more dielectric layers including one or more electrically insulating materials, e.g., silicon dioxide ($SiO_2$), an epoxy or encapsulation material, or the like. In some embodiments, the one or more structural layers 100CB include one or more substrates, e.g., thin silicon layers, interposers, or the like, positioned between circuits C1 and C2. In some embodiments, via structures VS include through-silicon via (TSV) structures positioned in the one or more structural layers 100CB of an IC device package.

In some embodiments, via structures VS include TSV structures having widths ranging from 1 micron to 50 microns. In some embodiments, via structures VS include TSV structures having widths ranging from 1 micron to 10 microns. Other ranges and/or values are within the scope of the present disclosure. As widths of via structures VS increase, parasitic resistance, voltage drops, and power dissipation decrease.

In some embodiments, circuits C1 and C2 are positioned on a single substrate, e.g., a semiconductor wafer or die including silicon and/or other semiconductor material. In some such embodiments, the one or more structural layers 100CB of boundary layer CB include one or more dielectric and/or silicon layers within which via structures VS and, if present, conductive paths L1 and L2 are positioned. In some embodiments, each of conductive paths L1 and L2, if present, is a metal interconnect structure.

In some embodiments, via structures VS include one or more vias directly contacting one or both of conductive paths LA or LB of the corresponding circuit C1 or C2. In some embodiments, via structures VS include TSV structures positioned in the one or more structural layers 100CB of a single substrate.

In some embodiments, via structures VS have widths ranging from 10 nanometers (nm) to 100 nm. In some embodiments, via structures VS have widths ranging from 25 nm to 75 nm. Other ranges and/or values are within the scope of the present disclosure. As widths of via structures VS decrease, area requirements decrease such that via structures VS are capable of connecting to DRAM array 100A having a high density.

In the embodiment depicted in FIGS. 1A and 1B, instances of via structures VS are positioned in a single X-Z plane and are thereby configured to electrically connect DRAM array 100A to computation circuit 100B. In various embodiments, e.g., non-limiting examples discussed below with respect to FIGS. 1C-1F, instances of via structures VS are otherwise positioned, e.g., in multiple X-Z planes, thereby being configured to electrically connect DRAM array 100A to computation circuit 100B.

In the embodiment depicted in FIGS. 1A and 1B, each via structure VS is included in one of bit lines B11-B1M and B21-B2M or control lines CL1 and CL2. In some embodiments, memory circuit 100 includes one or more control lines (not shown) in addition to control lines CL1 and CL2, and one or more instances of via structure VS are included in one or more of the additional control lines configured to carry one or more control signals and/or clock signals. The arrangement of bit lines B11-B1M and B21-B2M and control lines CL1 and CL2 depicted in FIG. 1B is a non-limiting example provided for the purpose of illustration. Other arrangements, e.g., one or both of control lines CL1 or CL2 positioned between one or more pairs of bit lines B11-B1M or B21-B2M, are within the scope of the present disclosure.

DRAM array 100A includes a plurality of DRAM cells MC (a single instance labeled in FIG. 1A for clarity), also referred to as memory cells MC in some embodiments. In the embodiment depicted in FIG. 1A, each DRAM cell MC includes a single NMOS transistor M1 and a single capacitive device CD1 coupled in series between a ground reference node (indicated by the analog ground symbol) and one of bit lines B11-B1M or B21-B2M corresponding to columns of DRAM cells MC. A gate of each transistor M1 is coupled to one of signal lines $CONV_1$-$CONV_N$ corresponding to rows of DRAM cells MC.

In the embodiment depicted in FIG. 1A, DRAM array 100A thereby includes DRAM cells MC configured to, responsive to signals (not labeled) received on signal lines $CONV_1$-$CONV_N$, receive and store data received on bit lines B11-B1M and B21-B2M, and output data to bit lines B11-B1M and B21-B2M, the data corresponding to bit line signals S11-S1M and S21-S2M. In some embodiments, DRAM array 100A includes DRAM cells MC otherwise configured to store and output data based on bit line signals S11-S1M and S21-S2M responsive to signals received on signal lines $CONV_1$-$CONV_N$. In various embodiments, a DRAM cell MC includes a PMOS transistor M1, a reference node other than a ground reference node, e.g., a power supply voltage (VDD) node, one or more transistors in addition to transistor M1, and/or one or more capacitive devices in addition to capacitive device CD1. In various embodiments, DRAM array 100A includes each DRAM cell MC coupled to multiple ones of bit lines B11-B1M and B21-B2M and/or bit lines B11-B1M and B21-B2M coupled to multiple DRAM cells MC in a same row.

In the embodiment depicted in FIGS. 1A and 1B, for the purpose of illustration, bit lines B11-B1M and B21-B2M and corresponding bit line signals S11-S1M and S21-S2M are arranged in two groups, each group including a number M of bit lines B11-B1M and B21-B2M and bit line signals S11-S1M and S21-S2M. In various embodiments, bit lines B11-B1M and B21-B2M and bit line signals S11-S1M and S21-S2M have arrangements other than that depicted in FIGS. 1A and 1B, e.g., including a single group or more than two groups, or including groups having varying numbers of bit lines and bit line signals.

DRAM array 100A is capable of storing data having a volume and configuration based on values of a number of rows N corresponding to signal lines $CONV_1$-$CONV_N$, the number of groups of bit lines B11-B1M and B21-B2M, and the number M of each group of bit lines B11-B1M and B21-B2M. A number of columns of DRAM array 100A corresponds to the number of groups of bit lines B11-B1M and B21-B2M times the number M of each group. The total volume of data bits capable of being stored in DRAM array 100A thereby corresponds to the number of columns times the number of rows N.

In the embodiment depicted in FIGS. 1A and 1B, the number of columns of DRAM array 100A is equal to the total number of bit lines B11-B1M and B21-B2M. In some embodiments, DRAM array 100A is otherwise configured whereby the number of columns is greater than the total number of bit lines B11-B1M and B21-B2M, e.g., by including more than one column electrically connected to each one of bit lines B11-B1M and B21-B2M and/or including a selection circuit such as a multiplexer between two or more columns and each one of bit lines B11-B1M and B21-B2M.

As data storage capacity increases, the number and type of potential applications of DRAM array 100A increase, and both array size and power consumption also increase. In some embodiments, DRAM array 100A has a data storage capacity ranging from 1 kilobit (kb) to 128 gigabits (Gb). In some embodiments, DRAM array 100A has a data storage capacity ranging from 1 megabit (Mb) to 16 Gb. In some embodiments, DRAM array 100A has a data storage capacity ranging from 128 Mb to 1 Gb. Other ranges and/or values are within the scope of the present disclosure.

In some embodiments, the number M of each group of bit lines B11-B1M and B21-B2M is equal to eight, corresponding to a byte of eight data bits, and DRAM 100A is thereby configured to be compatible with conventional memory configurations. Other values are within the scope of the present disclosure. In some embodiments, DRAM array 100A has a data storage capacity ranging from 1 megabyte (MB) to 16 gigabytes (GB). In some embodiments, DRAM array 100A has a data storage capacity ranging from 128 MB to 1 GB. Other ranges and/or values are within the scope of the present disclosure.

In some embodiments, the number M of each group of bit lines B11-B1M and B21-B2M corresponds to a size of weight data elements stored in DRAM array 100A and used in one or more operations performed by computation circuit 100B, as discussed below. As the size of the weight data element increases, weight data precision increases along with complexity and execution time of the one or more operations performed by computation circuit 100B.

In some embodiments, weight data element size corresponds to the number M having a value ranging from 2 to 16. In some embodiments, weight data element size corresponds to the number M having a value ranging from 4 to 12. In some embodiments, weight data element size corresponds to the number M having a value equal to 8, the weight data elements thereby corresponding to data bytes. Other ranges and/or values are within the scope of the present disclosure.

As the number of groups of bit lines B11-B1M and B21-B2M increases, the number of rows N corresponding to a given data storage capacity of DRAM array 100A decreases, and a number of units of data, e.g., weight elements and/or bytes, capable of being stored per row thereby increases. In some embodiments, the number of groups of bit lines B11-B1M and B21-B2M has a value ranging from 512 to 1 M. In some embodiments, the number of groups of bit lines B11-B1M and B21-B2M has a value ranging from 1 k to 128 k. In some embodiments, the number of groups of bit lines B11-B1M and B21-B2M has a value ranging from 4 k to 32 k. Other ranges and/or values are within the scope of the present disclosure.

As the number of rows N increases, the number of columns corresponding to a given data storage capacity of DRAM array 100A decreases, thereby reducing the total number of bit lines B11-B1M and B21-B2M and a corresponding number of signals propagated to computation circuit 100B in some embodiments. In some embodiments, the number of rows N has a value ranging from 8 to 128 k. In some embodiments, the number of rows N has a value ranging from 16 to 64 k. In some embodiments, the number of rows N has a value ranging from 128 to 32 k. Other ranges and/or values are within the scope of the present disclosure.

Computation circuit 100B is an IC configured to detect bit line signals S11-S1M and S21-S2M on bit lines B11-B1M and B21-B2M, receive an input signal IN on an input port INP, and generate an output signal OUT on an output port OUTP by performing one or more operations based on signals S11-S1M and S21-S2M and input signal IN.

Bit line signals S11-S1M and S21-S2M are electronic signals having voltage and/or current levels indicative of logical states of DRAM cells MC in a read operation of memory circuit 100. In some embodiments, a bit line signal S11-S1M or S21-S2M has a voltage level above a reference voltage level responsive to a charged state of capacitive device CD1 of a corresponding DRAM cell MC in a read operation, and a voltage level below the reference voltage level responsive to a discharged state of capacitive device CD1 of the corresponding DRAM cell MC in the read operation. In some embodiments, a reference voltage level is a midpoint between a ground reference voltage level and a power supply voltage level.

Control circuit 110A is an electronic circuit configured to generate and/or propagate one or more control and/or clock signals configured to control operation of DRAM 100A during read, write, and other operations. Memory circuit 100 is configured to propagate a first subset or all of the control and/or clock signals within DRAM 100A and propagate a second subset or all of the control and/or clock signals (represented in FIG. 1B as signals CS1 and CS2) to computation circuit 100B through control lines, e.g., control lines CL1 and CL2, positioned in boundary layer CB.

In the embodiment depicted in FIG. 1B, an entirety of control circuit 110A is positioned within circuit C1 such that signals CS1 and CS2 are propagated from circuit C1 to circuit C2 through boundary layer CB. In some embodiments, an entirety of control circuit 110A is positioned within circuit C2 such that signals CS1 and CS2 are propagated from circuit C2 to circuit C1 through boundary layer CB. In some embodiments, control circuit 110A is distributed among circuits C1 and C2 such that a first portion of signals CS1 and CS2 are propagated from circuit C1 to circuit C2 through boundary layer CB and a second portion of signals CS1 and CS2 are propagated from circuit C2 to circuit C1 through boundary layer CB.

In some embodiments, memory circuit 100 is configured to generate and propagate signals CS1 and CS2 configured to synchronize one or more timings of DRAM 100A and computation circuit 100B during various operations as discussed below.

Memory circuit 100 is configured to propagate bit line signals S11-S1M and S21-S2M on bit lines B11-B1M and B21-B2M and signals CS1 and CS2 on control lines CL1 and CL2 though via structures VS having various arrangements as illustrated by the non-limiting examples depicted in FIGS. 1C-1F. Each of FIGS. 1C-1F includes the X and Y directions and a portion of boundary layer CB including multiple instances of via structure VS positioned in the one or more structural layers 100CB.

Each of the embodiments depicted in FIGS. 1C-1F is simplified for the purpose of illustration. In various embodiments, boundary layer CB includes one or more elements in addition to those depicted in FIGS. 1C-1F, e.g., one or more instances of conductive path L1 and/or L2 electrically connected to one or more instances of via structure VS.

Figures 1C, 1D:
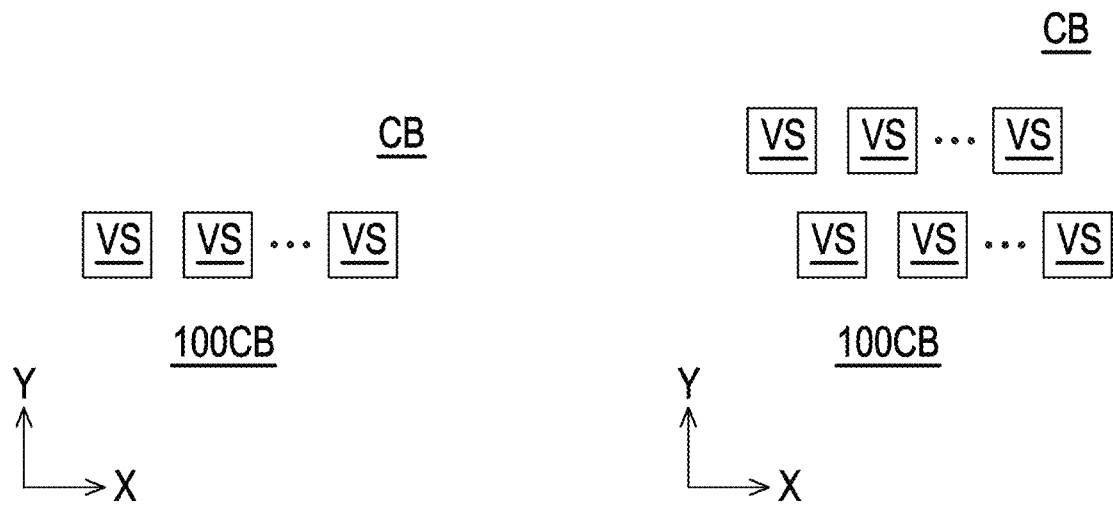

In the embodiment depicted in FIG. 1C, a single row of via structures VS extends in the X direction in accordance with the embodiment depicted in FIGS. 1A and 1B. In some embodiments, a single row of via structures VS extends in the Y direction.

The embodiment depicted in FIG. 1D includes first and second rows of via structures VS extending the X direction. The via structures VS in a given row are aligned in the Y direction with spaces between the via structures VS of the adjacent row. In some embodiments, the arrangement depicted in FIG. 1D corresponds to bit lines, e.g., bit lines B11-B1M and B21-B2M, and/or control lines, e.g., control lines CL1 and CL2, extending in the Y direction, the via structures VS of the first row being electrically connected to a first subset of the bit and/or control lines and the via structures VS of the second row being electrically connected to a second subset of the bit and/or control lines alternating with the first subset.

Figures 1E, 1F:
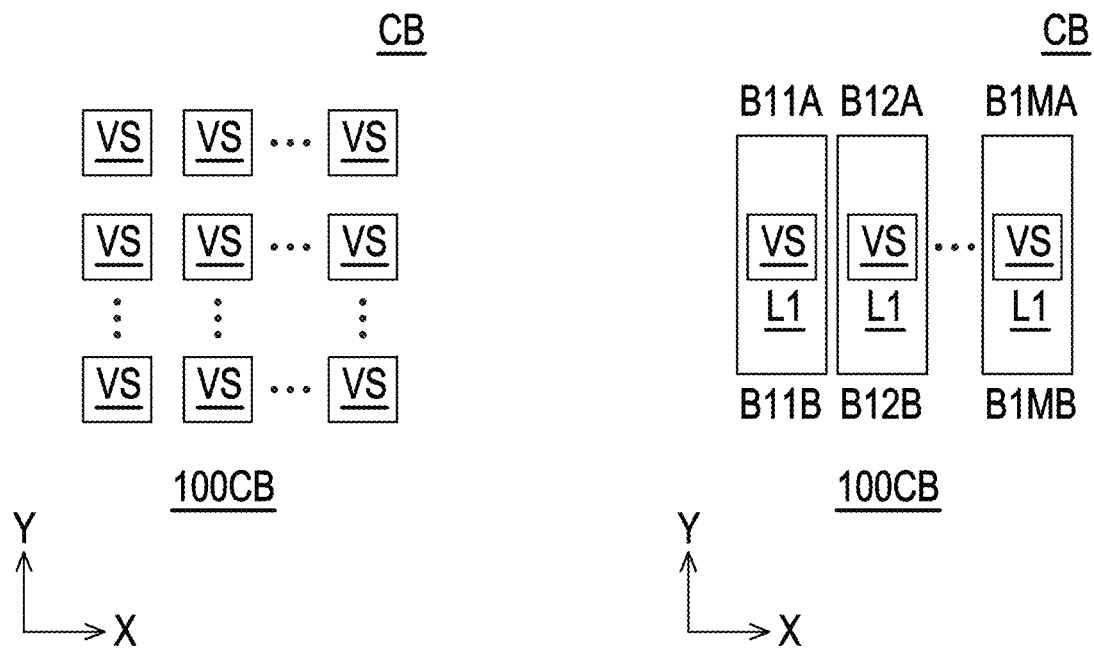

In the embodiment depicted in FIG. 1E, an array includes rows of via structures VS extending in the X direction, the instances of via structures VS being aligned in columns extending in the Y direction.

In the embodiment depicted in FIG. 1F, instances of via structures VS are electrically connected to instances of conductive path L1 extending in the Y direction. The instances of conductive path L1 correspond to an embodiment of DRAM 100A in which a first sub-array includes bit lines B11A, B12A, . . . B1MA and a second sub-array includes bit lines B11B, B12B, . . . B1MB, each electrically connected to the corresponding instances of conductive path L1. The sub-arrays are thereby configured to share electrical connections to sense amplifier SA through the corresponding instances of via structure VS. In some embodiments, the sub-arrays are otherwise configured to share electrical connections to sense amplifier SA through corresponding instances of via structure VS, e.g., by including multiple electrical connections in conductive path LA instead of conductive path L1.

The embodiments depicted in FIGS. 1C-1F are non-limiting examples presented for the purpose of illustration. Other arrangements of instances of via structures VS are within the scope of the present disclosure. In some embodiments, the arrangement of via structures VS in boundary layer CB includes one or more combinations of the embodiments depicted in FIGS. 1C-1F.

Computation circuit 100B includes sense amplifier circuit SA configured to generate sense amplifier signals based on bit line signals S11-S1M and S21-S2M received on bit lines B11-B1M and B21-B2M though via structures VS, the sense amplifier signals thereby being indicative of the logical states of corresponding DRAM cells MC in the read operation of memory circuit 100. In various embodiments, sense amplifier SA is configured to generate sense amplifier signals as digital signals, e.g., sense amplifier signals DS11-DS1M and DS21-DS2M discussed below with respect to FIG. 2, or to generate sense amplifier signals as analog signals, e.g., sense amplifier signals AS11-AS1M and AS21-AS2M discussed below with respect to FIG. 3.

Input signal IN, also referred to as an input vector IN in some embodiments, is one or more electronic signals including signal levels corresponding to a plurality of input data elements. In some embodiments, each data element of the plurality of data elements includes a plurality of data bits, e.g., eight data bits corresponding to a data byte. In some embodiments, computation circuit 100B includes a selection circuit (not shown) configured to, in operation, select individual bits of each data element of the plurality of data elements, e.g., sequentially. In various embodiments, input port INP includes a parallel or serial port configured to receive input signal IN.

As a number and size of data elements of input signal IN increases, the number and types of potential applications of computation circuit 100B increase, and circuit complexity also increases. In some embodiments, computation circuit 100B is configured to receive input signal IN including the number of data elements ranging from 8 to 1 M. In some embodiments, computation circuit 100B is configured to receive input signal IN including the number of data elements ranging from 1 k to 500 k. In some embodiments, computation circuit 100B is configured to receive input signal IN including the number of data elements ranging from 50 k to 200 k. Other ranges and/or values are within the scope of the present disclosure.

In some embodiments, computation circuit 100B is configured to receive input signal IN including data elements having a number of bits ranging from 2 to 16. In some embodiments, computation circuit 100B is configured to receive input signal IN including data elements having the number of bits ranging from 4 to 12. In some embodiments, computation circuit 100B is configured to receive input signal IN including data elements having 8 bits. Other ranges and/or values are within the scope of the present disclosure.

Computation circuit 100B is configured to generate output signal OUT, also referred to as an output vector OUT, as a data signal including multiple data elements, each data element including a plurality of data bits. Increasing number and size of the data elements of output signal OUT correspond to increasing numbers and types of potential applications of computation circuit 100B, and to increasing circuit complexity. In various embodiments, output port OUTP includes a parallel or serial port configured to propagate output signal OUT.

In some embodiments, computation circuit 100B is configured to generate output signal OUT including the number of data elements ranging from 8 to 100 k. In some embodiments, computation circuit 100B is configured to generate output signal OUT including the number of data elements ranging from 100 to 50 k. In some embodiments, computation circuit 100B is configured to generate output signal OUT including the number of data elements ranging from 500 to 5 k. Other ranges and/or values are within the scope of the present disclosure.

In some embodiments, computation circuit 100B is configured to generate output signal OUT including data elements having a number of bits ranging from 2 to 16. In some embodiments, computation circuit 100B is configured to generate output signal OUT including data elements having the number of bits ranging from 4 to 12. In some embodiments, computation circuit 100B is configured to generate output signal OUT including data elements having 8 bits. Other ranges and/or values are within the scope of the present disclosure.

Computation circuit 100B is configured to perform the one or more operations by logically combining the sense amplifier output signals with input signal IN. In some embodiments in which DRAM array 100A is configured to store weight data elements, input signal IN corresponds to input elements of a neural network, e.g., a CNN, and/or input elements of a neural network layer, e.g., a hidden layer.

In some embodiments, computation circuit 100B is configured to combine the sense amplifier output signals with data elements of input signal IN by performing one or more matrix operations, e.g., a MAC operation. In some embodiments, computation circuit 100B is configured to combine the sense amplifier output signals with data elements of input signal IN by performing one or more of a summation function, a scaling function, or a rectified linear unit (ReLU) function.

In some embodiments, computation circuit 100B is configured to combine the sense amplifier output signals with data elements of input signal IN by sequentially selecting data bits of each data element of input signal IN. In some embodiments, computation circuit 100B is configured to combine the sense amplifier output signals with data elements of input signal IN by sequentially selecting some or all of rows $CONV_1$-$CONV_N$ in a series of read operations.

In some embodiments, memory circuit 100 is configured as a neural network in which computation circuit 100B is configured to perform a sequence of operations corresponding to layers of the neural network based on weight data elements stored in DRAM array 100A. In such embodiments, input signal IN is the input to a first layer of the neural network, and output data of the first and successive layers are input data to corresponding subsequent layers of the neural network, with the output data of the final layer corresponding to output signal OUT. At each layer of the neural network, computation circuit 100B is configured to perform at least one of the one or more operations based on a subset of the weight data elements accessed by sequential read operations on DRAM array 100A. In some embodiments, memory circuit 100 is configured as a sixteen layer visual geometry group (VGG-16) CNN configured to receive input signal IN including data elements corresponding to a visual image. Other numbers of layers and/or types of neural networks are within the scope of the present disclosure.

In some embodiments, each row of rows $CONV_1$-$CONV_N$ is configured to store the weight data elements corresponding to a single layer of a neural network. In various embodiments, one or more individual rows of rows $CONV_1$-$CONV_N$ are configured to store the weight data elements corresponding to multiple layers of a neural network, and/or multiple rows of rows $CONV_1$-$CONV_N$ are configured to store the weight data elements corresponding to a single layer of a neural network.

By the configuration discussed above, memory circuit 100 is capable of performing CIM operations using computation circuit 100B based on weight data elements stored in DRAM array 100A. Compared to other approaches, memory circuit 100 is capable of performing CIM operations based on high memory capacity using a smaller area and lower power level. In various applications, e.g., CNN applications, memory circuit 100 enables the weight data elements to be efficiently applied to input signal IN as part of MAC and other matrix operations.

Figure 2:
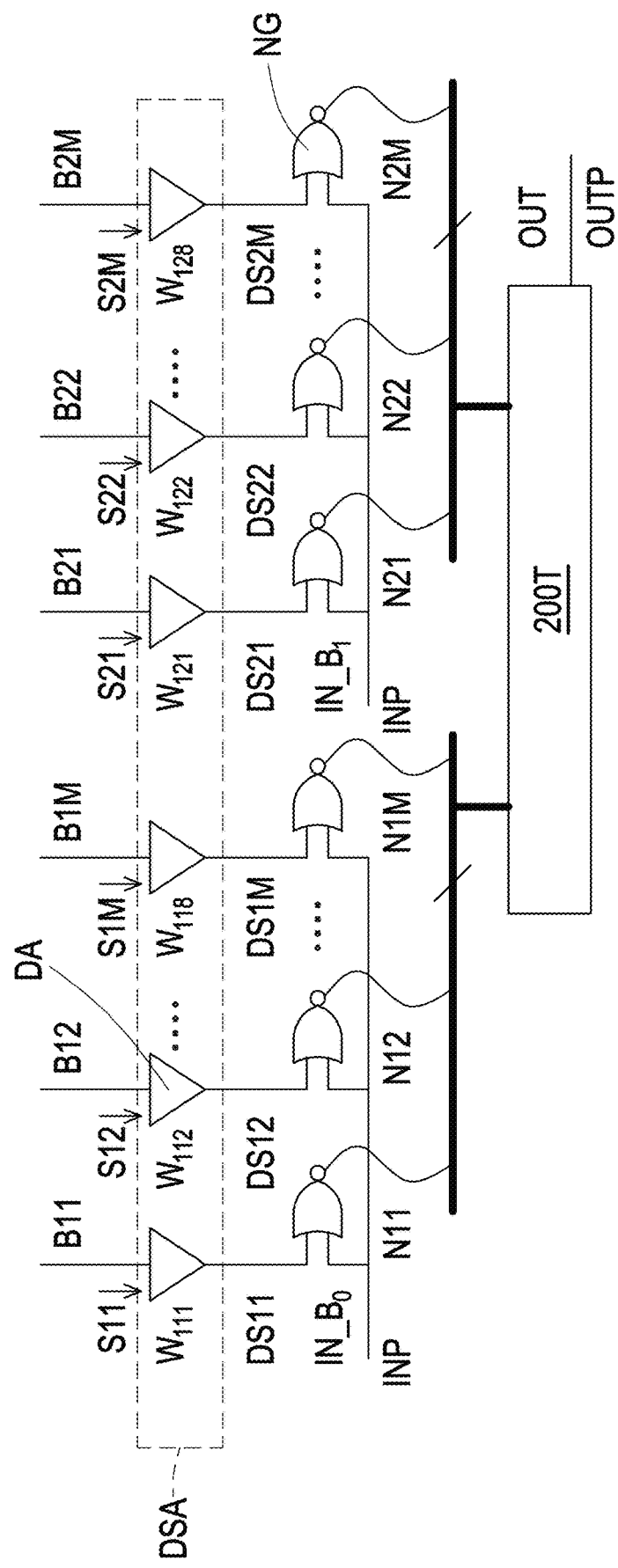
FIG. 2 is a diagram of a computation circuit, in accordance with some embodiments.

FIG. 2 is a diagram of a computation circuit 200, in accordance with some embodiments. Computation circuit 200 is usable as some or all of computation circuit 100B discussed above with respect to FIGS. 1A-1F.

Computation circuit 200 is an IC including a sense amplifier circuit DSA, NOR gates NG (a single instance labeled for clarity), and an adder tree circuit 200T. Sense amplifier circuit DSA is usable as sense amplifier SA, discussed above with respect to FIGS. 1A-1F, and includes input terminals coupled to bit lines B11-B1M and B21-B2M, and output terminals coupled to first input terminals of NOR gates NG. NOR gates NG include second input terminals coupled to input port INP and configured to receive portions of input signal IN as discussed below, and output terminals coupled to input terminals of adder tree circuit 200T. Adder tree circuit 200T is coupled to output port OUTP.

Sense amplifier circuit DSA is an IC including sense amplifiers DA (a single instance labeled for clarity) configured to receive bit line signals S11-S1M and S21-S2M on bit lines B11-B1M and B21-B2M, and generate sense amplifier signals DS11-DS1M and DS21-DS2M as digital signals indicative of voltage and/or current levels of bit line signals S11-S1M and S21-S2M. In some embodiments, sense amplifiers DA include cross-coupled transistors configured to generate sense amplifier signals DS11-DS1M and DS21-DS2M having logical states based on voltage levels of bit line signals S11-S1M and S21-S2M relative to a reference voltage level, as discussed above with respect to FIGS. 1A and 1B.

In the embodiment depicted in FIG. 2, each instance of sense amplifier DA is coupled to a single one of bit lines B11-B1M or B21-B2M. In some embodiments, each of one or more instances of sense amplifier DA is coupled to two or more of bit lines B11-B1M or B21-B2M.

In the embodiment depicted in FIG. 2, sense amplifier circuit DSA includes sense amplifiers DA configured to receive bit line signals S11-S1M and S21-S2M and generate sense amplifier signals DS11-DS1M and DS21-DS2M having the number M equal to 8, thereby corresponding to byte-size weight data elements $W_{111}$-$W_{118}$ and $W_{121}$-$W_{128}$. In the non-limiting example depicted in FIG. 2, weight data elements $W_{111}$-$W_{118}$ and $Wi21$-$W_{128}$ correspond to data stored in row $CONV_1$, weight data elements $W_{111}$-$W_{118}$ correspond to the eight bits of a first weight data element, and weight data elements $W_{121}$-$W_{128}$ correspond to the eight bits of a second weight data element.

In some embodiments, sense amplifier circuit DSA includes sense amplifiers DA configured to receive bit line signals S11-S1M and S21-S2M and generate sense amplifier signals DS11-DS1M and DS21-DS2M having the number M equal to a value other than 8, as discussed above with respect to FIGS. 1A and 1B.

In the embodiment depicted in FIG. 2, NOR gates NG are arranged in groups corresponding to the groups of bit lines B11-B1M and B21-B2M, each group including the number M of NOR gates NG. The second input terminal of each NOR gate NG within a given group is configured to receive a same portion of input signal IN, e.g., a same bit of a same data element corresponding to a particular sequence step.

In the embodiment depicted in FIG. 2, a first group of NOR gates NG is configured to receive portion IN_$B_0$ of input signal IN, and a second group of NOR gates NG is configured to receive portion IN_$B_1$ of input signal IN. In some embodiments, NOR gates NG include groups configured to receive a number of portions of input signal IN greater than two.

NOR gates NG are thereby configured to generate NOR signals N11-N1M and N21-N2M based on the logical states of sense amplifier signals DS11-DS1M and DS21-DS2M and the portions of input signal IN corresponding to the NOR gate NG groups.

Adder tree circuit 200T is an IC including adders (not shown in FIG. 2) configured to generate a summation data element based on NOR signals N11-N1M and N21-N2M received from NOR gates NG. In some embodiments, the summation data element is some or all of output signal OUT. In some embodiments, adder tree circuit 200T includes one more circuit elements (not shown), e.g., an accumulator circuit, configured to generate some or all of output signal OUT based on the summation data element. In some embodiments, the one or more circuit elements are configured to generate some or all of output signal OUT based on multiple instances of summation data elements, e.g., generated sequentially in operation. In some embodiments, adder tree circuit 200T includes one or more instances of an adder tree circuit 400 discussed below with respect to FIG. 4.

An adder is an electronic circuit including one or more logic gates configured to perform a mathematical operation, e.g., addition, based on received first and second data elements, e.g., first and second ones of NOR signals N11-N1M and N21-N2M, thereby generating a sum data element equal to the sum of the received first and second data elements. In some embodiments, the adder is configured to generate the sum data element including a number of bits one greater than the number of bits of each of the received first and second data elements. In various embodiments, the adder includes one or more full adder gates, half adder gates, ripple-carry adder circuits, carry-save adder circuits, carry-select adder circuits, carry-look-ahead adder circuits, or other circuits suitable for performing some or all of an addition operation.

By the configuration discussed above, computation circuit 200 is capable of performing some or all of the operations, e.g., matrix operations, whereby output signal OUT is generated on output port OUTP, the one or more operations being based on bit line signals S11-S1M and S21-S2M and input signal IN. A memory circuit including computation circuit 200 is thereby capable of realizing the benefits discussed above with respect to memory circuit 100.

Figure 3:
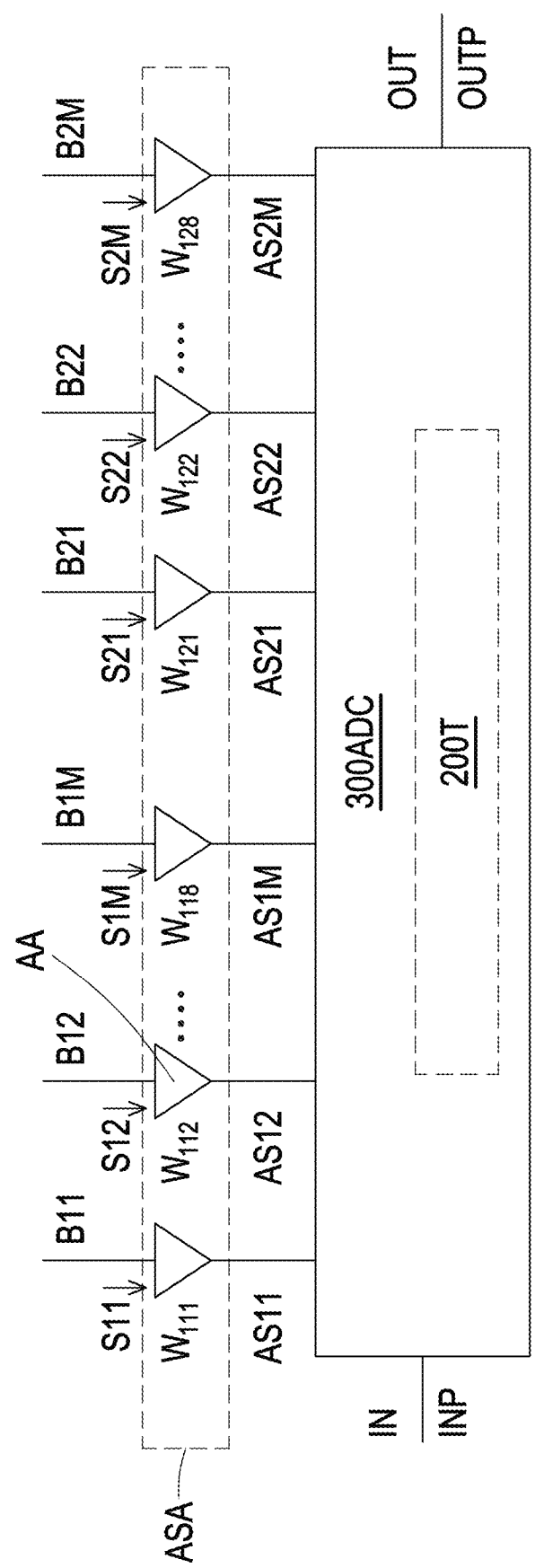
FIG. 3 is a diagram of a computation circuit, in accordance with some embodiments.

FIG. 3 is a diagram of a computation circuit 300, in accordance with some embodiments. Computation circuit 300 is usable as some or all of computation circuit 100B discussed above with respect to FIGS. 1A-1F.

Computation circuit 300 is an IC including a sense amplifier circuit ASA and an analog-to-digital-converter (ADC) circuit 300ADC including, in some embodiments, adder tree circuit 200T discussed above with respect to FIG. 2. Sense amplifier circuit ASA is usable as sense amplifier SA, discussed above with respect to FIGS. 1A-1F, and includes input terminals coupled to bit lines B11-B1M and B21-B2M, and output terminals coupled to input terminals of ADC circuit 300ADC. ADC circuit 300ADC is coupled to each of input port INP and output port OUTP.

Sense amplifier circuit ASA is an IC including sense amplifiers AA (a single instance labeled for clarity) configured to receive bit line signals S11-S1M and S21-S2M on bit lines B11-B1M and B21-B2M, and generate sense amplifier signals AS11-AS1M and AS21-AS2M as analog signals indicative of voltage and/or current levels of bit line signals S11-S1M and S21-S2M. In some embodiments, sense amplifiers SA include buffers or the like configured to generate sense amplifier signals AS11-AS1M and AS21-AS2M having voltage magnitudes based on voltage and/or current levels of bit line signals S11-S1M and S21-S2M.

ADC circuit 300ADC is an IC configured to generate output signal OUT on output port OUTP by performing one or more operations based on sense amplifier signals AS11-AS1M and AS21-AS2M received from sense amplifier circuit ASA, and input signal IN received on input port INP. In some embodiments, ADC circuit 300ADC is configured to generate output signal OUT by performing one or more of a matrix computation, a summation function, a scaling function, or a ReLU function. In some embodiments, ADC circuit 300ADC includes adder tree circuit 200T configured to perform the summation function. In some embodiments, ADC circuit 300ADC includes one more circuit elements (not shown), e.g., an accumulator circuit, configured to perform one or more operations as part of generating some or all of output signal OUT.

By the configuration discussed above, computation circuit 300 is capable of performing some or all of the operations, e.g., matrix operations, whereby output signal OUT is generated on output port OUTP, the one or more operations being based on bit line signals S11-S1M and S21-S2M and input signal IN. A memory circuit including computation circuit 300 is thereby capable of realizing the benefits discussed above with respect to memory circuit 100.

Figure 4:
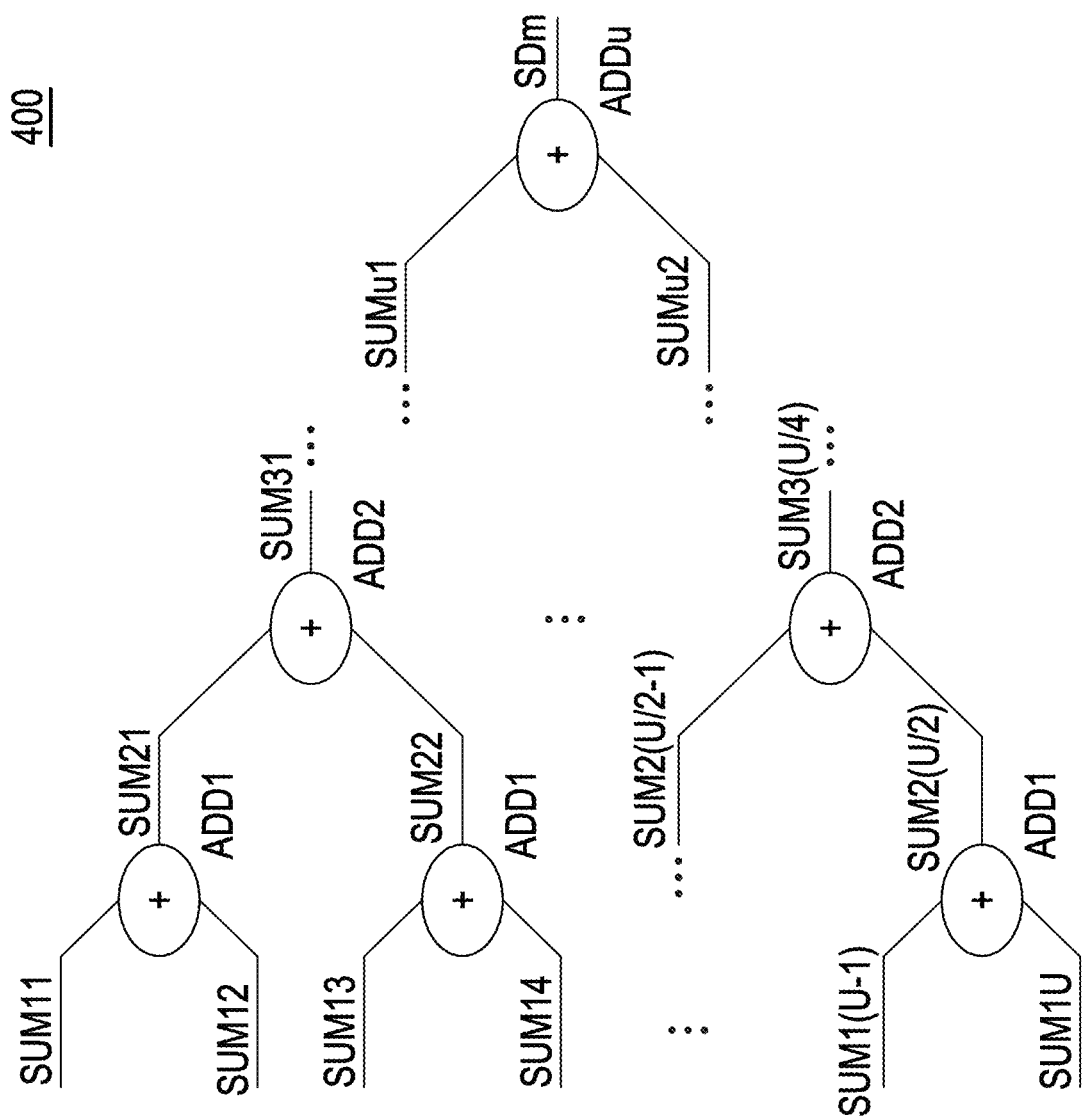
FIG. 4 is a diagram of an adder tree circuit, in accordance with some embodiments.

FIG. 4 is a diagram of adder tree circuit 400, in accordance with some embodiments. Adder tree circuit 400 is usable as some or all of adder tree circuit 200T discussed above with respect to FIGS. 2 and 3. Adder tree circuit 400 includes a number u of layers of adders ADD1-ADDu.

A first layer of adders includes adders ADD1 configured to receive a number U (=2u) of data elements SUM11-SUM1U, the first layer thereby including a number U/2 of adders ADD1. In some embodiments, data elements SUM11-SUM1U correspond to some or all of NOR signals N11-N1M and N21-N2M discussed above with respect to FIG. 2. In some embodiments, data elements SUM11-SUM1U correspond to internal signals of ADC circuit 300ADC discussed above with respect to FIG. 3.

Each adder ADD1 is configured to perform an addition operation on a corresponding received pair of data elements, e.g., SUM11 and SUM12, of data elements SUM11-SUM1U, and output the sum as a corresponding one of data elements SUM21-SUM2(U/2). Adders ADD1 are configured to receive data elements SUM11-SUM1U including a first number of bits, and output data elements SUM21-SUM2(U/2) including a second number of bits one greater than the first number of bits.

A second layer of adders includes a number U/4 of adders ADD2. Each adder ADD2 is configured to perform an addition operation on a corresponding received pair of data elements, e.g., SUM21 and SUM22, of data elements SUM21-SUM2(U/2), and output the sum as a corresponding one of data elements SUM31-SUM3(U/4). Adders ADD2 are configured to receive data elements SUM21-SUM2(U/2) including the second number of bits and output data elements SUM31-SUM3(U/4) including a third number of bits one greater than the second number of bits.

A last layer of adders includes the single adder ADDu configured to perform an addition operation on a pair of data elements SUMu1 and SUMu2 received from a preceding layer of adders, and output the sum as a summation data element SDm. Adder ADDu is configured to receive data elements SUMu1 and SUMu2 including a fourth number of bits and output summation data element SDm including a fifth number of bits one greater than the fourth number of bits and equal to the first number of bits plus the number u. In some embodiments, e.g., those in which adder tree circuit 400 is used as some or all of adder tree circuit 200T, summation data element SDm corresponds to some or all of output signal OUT discussed above with respect to FIGS. 1A-3.

In various embodiments, adder tree circuit 400 includes one or more additional layers of adders between the second and last layers depicted in FIG. 4, each additional layer being configured consistently with the configurations of the first, second, and last layers discussed above such that, in operation, summation data element SDm is generated based on received data elements SUM11-SUM1U. In some embodiments, adder tree circuit 400 does not include the second layer of adders ADD2, and thereby includes a total of u=2 layers such that, in operation, summation data element SDm is generated based on a total of U=4 data elements SUM11-SUM1U.

As the total number of layers increases, the number of potential applications of adder tree circuit 400 increases along with circuit size and complexity. In some embodiments, adder tree circuit 400 includes the total number of layers ranging from 2 to 9. In some embodiments, adder tree circuit 400 includes the total number of layers ranging from 4 to 7.

Adder tree circuit 400 is thereby configured to be capable of performing the operations discussed above with respect to adder tree circuit 200T and FIGS. 2 and 3. By including adder tree circuit 400 as some or all of adder tree circuit 200T in one of computation circuits 200 or 300, a memory circuit is capable of realizing the benefits discussed above with respect to memory circuit 100.

Figure 5:
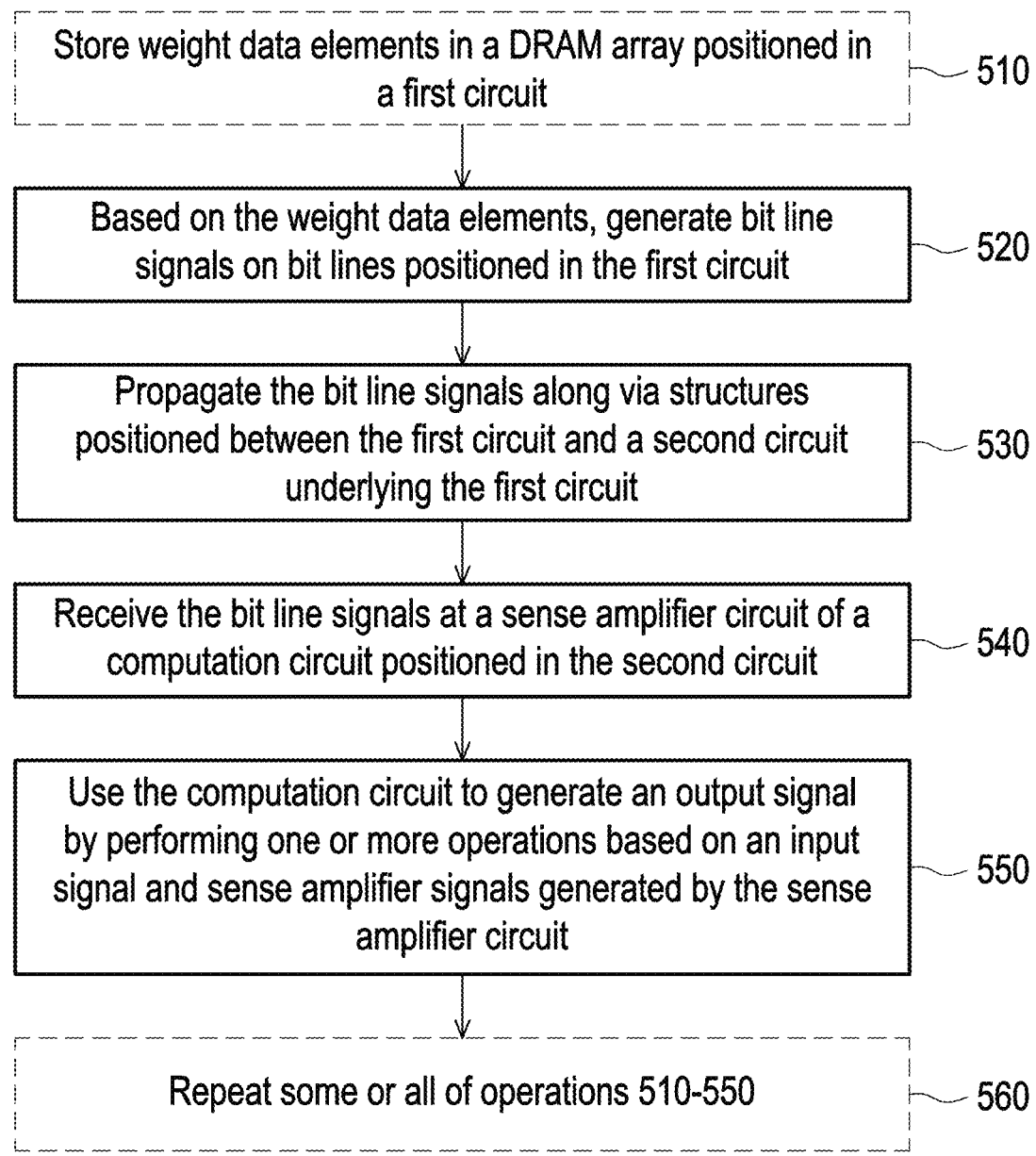
FIG. 5 is a flowchart of a method of operating a memory circuit, in accordance with some embodiments.

FIG. 5 is a flowchart of a method 500 of operating a memory circuit, in accordance with some embodiments. Method 500 is usable with a memory circuit, e.g., memory circuit 100 discussed above with respect to FIGS. 1A-4.

The sequence in which the operations of method 500 are depicted in FIG. 5 is for illustration only; the operations of method 500 are capable of being executed simultaneously or in sequences that differ from that depicted in FIG. 5. In some embodiments, operations in addition to those depicted in FIG. 5 are performed before, between, during, and/or after the operations depicted in FIG. 5. In some embodiments, the operations of method 500 are a subset of a method of operating a neural network.

At operation 510, in some embodiments, weight data elements are stored in a DRAM array positioned in a first circuit. In some embodiments, storing the weight data elements includes storing weight data corresponding to one or more layers of a neural network. In some embodiments, storing the weight data elements in the DRAM array includes storing weight data in rows corresponding to layers of the neural network. In some embodiments, storing the weight data elements includes storing weight data corresponding to a VGG-16 CNN.

In some embodiments, storing the weight data elements in the DRAM array positioned in the first circuit includes the first circuit being some or all of a first semiconductor wafer or die of an IC package. In some embodiments, storing the weight data elements in the DRAM array positioned in the first circuit includes the first circuit being some or all of a first layer within a semiconductor wafer or die. In some embodiments, storing the weight data elements in the DRAM array positioned in the first circuit includes storing weight data in DRAM array 100A positioned in circuit C1 of memory circuit 100, discussed above with respect to FIGS. 1A-1F.

At operation 520, based on the weight data elements, bit line signals are generated on bit lines positioned in the first circuit. Generating the bit line signals on the bit lines includes selecting a subset of the weight data elements stored in a row of memory cells of the DRAM array as part of performing a read operation on the DRAM array. In some embodiments, selecting the subset of the weight data elements includes selecting a row $CONV_1$-$CONV_N$ of memory cells MC as part of a read operation on DRAM array 100A, discussed above with respect to FIGS. 1A-1F.

At operation 530, the bit line signals are propagated along via structures positioned between the first circuit and a second circuit underlying the first circuit. In some embodiments, propagating the bit line signals includes using via structures positioned between semiconductor wafers and/or dies of an IC package. In some embodiments, propagating the bit line signals includes using via structures positioned between layers of a semiconductor wafer or die. In some embodiments, propagating the bit line signals includes propagating bit line signals S11-S1M and S21-S2M using via structures VS discussed above with respect to FIGS. 1A-1F.

In some embodiments, propagating the bit line signals includes propagating one or more of control and/or clock signals CS1 and CS2, discussed above with respect to FIGS. 1A-1F, along via structures positioned between the first and second circuits.

At operation 540, the bit line signals are received at a sense amplifier circuit of a computation circuit positioned in the second circuit. Receiving the bit line signals at the sense amplifier circuit of the computation circuit positioned in the second circuit includes receiving the bit line signals at the computation circuit positioned in the second circuit located above or below the first circuit.

In some embodiments, receiving the bit line signals at the computation circuit positioned in the second circuit includes receiving the bit line signals in a second semiconductor wafer and/or die of an IC package. In some embodiments, receiving the bit line signals at the computation circuit positioned in the second circuit includes receiving the bit line signals in a second layer of a semiconductor wafer or die. In some embodiments, receiving the bit line signals at the computation circuit positioned in the second circuit includes receiving bit line signals S11-S1M and S21-S2M at computation circuit 100B positioned in circuit C2 of memory circuit 100, discussed above with respect to FIGS. 1A-1F.

In some embodiments, receiving the bit line signals at the sense amplifier circuit of the computation circuit includes receiving bit line signals S11-S1M and S21-S2M at sense amplifier circuit DSA of computation circuit 200 discussed above with respect to FIG. 2. In some embodiments, receiving the bit line signals at the sense amplifier circuit of the computation circuit includes receiving bit line signals S11-S1M and S21-S2M at sense amplifier circuit ASA of computation circuit 300 discussed above with respect to FIG. 3.

At operation 550, the computation circuit is used to generate an output signal by performing one or more operations based on an input signal and sense amplifier signals generated by the sense amplifier circuit. Performing the one or more operations includes performing one or more matrix operations, e.g., a MAC computation, a summation function, a scaling function, or a ReLU function.

In some embodiments, using the computation circuit includes using computation circuit 100B discussed above with respect to FIGS. 1A-1F. In some embodiments, using the computation circuit includes using computation circuit 200 discussed above with respect to FIG. 2. In some embodiments, using the computation circuit includes using computation circuit 300 discussed above with respect to FIG. 3.

In some embodiments, generating the output signal by performing the one or more operations based on the input signal includes generating output signal OUT by performing the one or more operations based on input signal IN as discussed above with respect to FIGS. 1A-4.

In some embodiments, performing the one or more operations based on the sense amplifier signals generated by the sense amplifier circuit includes using the sense amplifier circuit to generate the sense amplifier signals as digital or analog signals based on the bit line signals received at the sense amplifier circuit.

In some embodiments, performing the one or more operations based on the sense amplifier signals generated by the sense amplifier circuit includes performing the one or more operations based on sense amplifier signals DS11-DS1M and DS21-DS2M generated by sense amplifier circuit DSA as discussed above with respect to FIG. 2. In some embodiments, performing the one or more operations based on the sense amplifier signals generated by the sense amplifier circuit includes performing the one or more operations based on sense amplifier signals AS11-AS1M and AS21-AS2M generated by sense amplifier circuit ASA as discussed above with respect to FIG. 3.

In some embodiments, performing the one or more operations includes using an adder tree circuit to perform the summation operation. In some embodiments, using the adder tree circuit to perform the summation operation includes using adder tree circuit 200T as discussed above with respect to FIGS. 2 and 3. In some embodiments, using the adder tree circuit to perform the summation operation includes using adder tree circuit 400 as discussed above with respect to FIG. 4.

In some embodiments, performing the one or more operations includes synchronizing the one or more operations with one or more operations of the DRAM array, e.g, by using control and/or clock signals CS1 and CS2 discussed above with respect to FIGS. 1A-1F.

At operation 560, in some embodiments, some or all of operations 510-550 are repeated. In some embodiments, repeating some or all of operations 510-550 includes synchronizing execution of some or all of operations 510-550, e.g., by using control and/or clock signals CS1 and CS2 discussed above with respect to FIGS. 1A-1F.

In some embodiments, repeating some or all of operations 510-550 includes each instance of some or all of operations 510-550 corresponding to performing some or all of the matrix operations of a step of a multi-step operation of a layer of a neural network. In some embodiments, repeating some or all of operations 510-550 includes each instance of some or all of operations 510-550 corresponding to performing some or all of the matrix operations of a layer of a neural network. In some embodiments, repeating some or all of operations 510-550 includes each instance of some or all of operations 510-550 corresponding to performing some or all of the operations of a layer of a VGG-16 CNN.

By executing some or all of the operations of method 500, weight data elements stored in a DRAM array positioned in a first circuit are used in one or more operations of a neural network performed by a computation circuit positioned in a second circuit, thereby realizing the benefits discussed above with respect to memory circuit 100.

Figure 6:
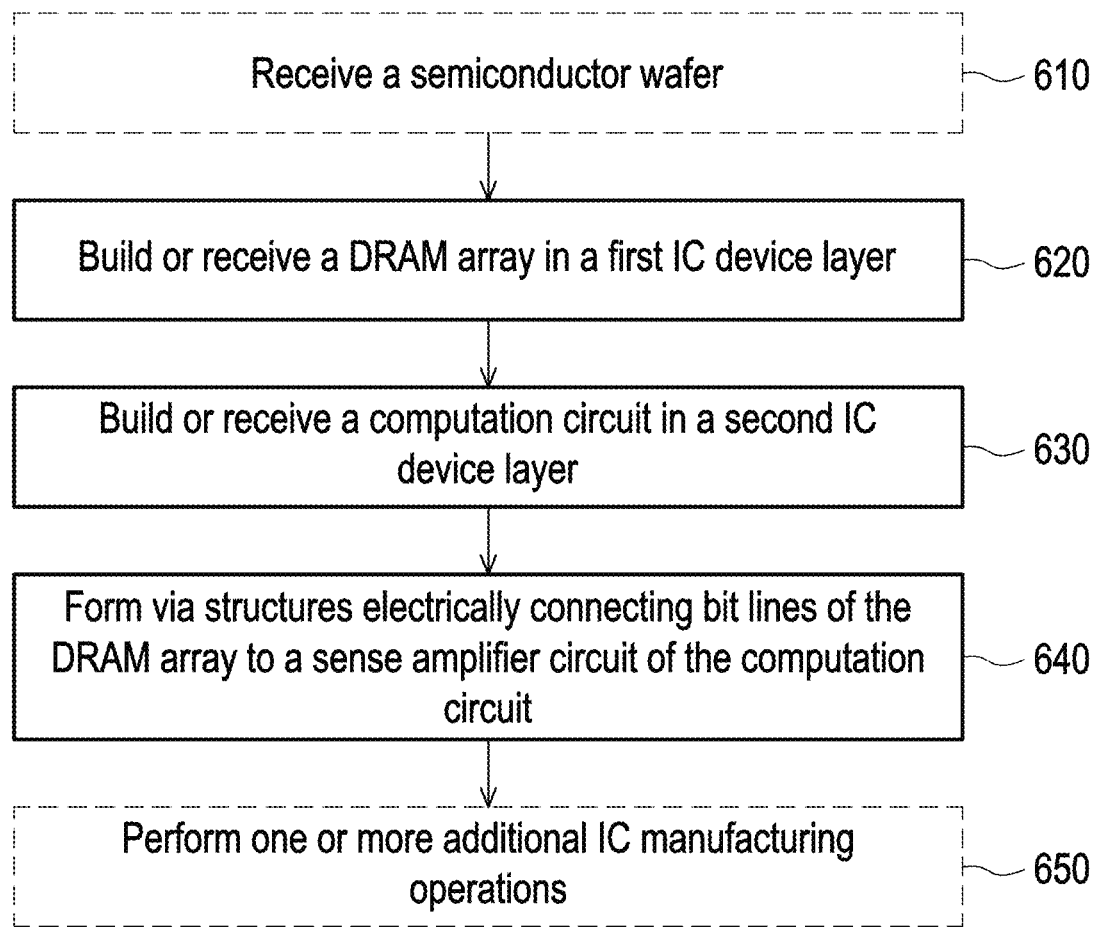
FIG. 6 is a flowchart of a method of manufacturing a memory circuit, in accordance with some embodiments.

FIG. 6 is a flowchart of a method 600 of manufacturing an IC device, in accordance with some embodiments. Method 600 is operable to form a memory circuit 100 discussed above with respect to FIGS. 1A-4. In some embodiments, operations of method 600 are a subset of operations of a method of forming an IC package, e.g., a 2.5D IC package, a 3D IC package, or an InFO package. In some embodiments, operations of method 600 are a subset of operations of a method of forming a semiconductor wafer or die.

In some embodiments, the operations of method 600 are performed in the order depicted in FIG. 6. In some embodiments, the operations of method 600 are performed in an order other than the order depicted in FIG. 6. In some embodiments, one or more additional operations are performed before, during, between, and/or after the operations of method 600.

At operation 610, in some embodiments, a partially processed semiconductor wafer is received. Receiving the partially processed semiconductor wafer includes receiving a substrate including silicon and/or one or more other suitable semiconductor materials.

At operation 620, a DRAM array is built or received in a first IC device layer. In some embodiments, building or receiving the DRAM array includes building or receiving the DRAM array in the first IC device layer being a first semiconductor wafer or die. In some embodiments, building or receiving the DRAM array includes receiving the DRAM array in the first IC device layer being the first semiconductor wafer or die as part of an IC packaging process.

In some embodiments, building or receiving the DRAM array includes building the DRAM array in the first IC device layer being a first layer of the partially processed semiconductor wafer.

Building the DRAM array in the first semiconductor wafer or die or in the first layer of the partially processed semiconductor wafer includes building a first plurality of IC devices, e.g., transistors, logic gates, memory cells, interconnect structures, and/or other suitable devices, configured to operate as discussed above with respect to DRAM array 100A and FIGS. 1A-1F.

Building the DRAM array includes performing a first plurality of manufacturing operations, e.g., one or more of a lithography, diffusion, deposition, etching, planarizing, or other operation suitable for building the first plurality of IC devices in the first IC device layer.

In some embodiments, building or receiving the DRAM array in the first IC device layer includes building or receiving DRAM array 100A positioned in circuit C1 of memory circuit 100, discussed above with respect to FIGS. 1A-1F.

At operation 630, a computation circuit is built or received in a second IC device layer. In some embodiments, building or receiving the computation circuit includes building or receiving the computation circuit in the second IC device layer being a second semiconductor wafer or die. In some embodiments, building or receiving the computation circuit includes receiving the computation circuit in the second IC device layer being the second semiconductor wafer or die as part of the IC packaging process.

In some embodiments, building or receiving the computation circuit includes building the computation circuit in the second IC device layer being a second layer of the partially processed semiconductor wafer. In some embodiments, building the computation circuit in the second layer of the partially processed semiconductor wafer includes building the second layer below the first layer of the partially processed semiconductor wafer. In some embodiments, building the computation circuit in the second layer of the partially processed semiconductor wafer includes building the second layer before building the first layer of the partially processed semiconductor wafer.

Building the computation circuit in the second semiconductor wafer or die or in the second layer of the partially processed semiconductor wafer includes building a second plurality of IC devices, e.g., transistors, logic gates, memory cells, interconnect structures, and/or other suitable devices, configured to operate as discussed above with respect to computation circuit 100B and FIGS. 1A-1F.

Building the computation circuit includes performing a second plurality of manufacturing operations, e.g., one or more of a lithography, diffusion, deposition, etching, planarizing, or other operation suitable for building the second plurality of IC devices in the second IC device layer.

In some embodiments, building or receiving the computation circuit in the second IC device layer includes building or receiving computation circuit 100B positioned in circuit C2 of memory circuit 100, discussed above with respect to FIGS. 1A-1F.

In some embodiments, building or receiving the computation circuit includes building or receiving computation circuit 200 discussed above with respect to FIG. 2. In some embodiments, building or receiving the computation circuit includes building or receiving NOR gates NG coupled to sense amplifier circuit DSA and adder tree circuit 200T, discussed above with respect to FIG. 2.

In some embodiments, building or receiving the computation circuit includes building or receiving computation circuit 300 discussed above with respect to FIG. 3. In some embodiments, building or receiving the computation circuit comprises building or receiving ADC circuit 300ADC coupled to sense amplifier circuit ASA, discussed above with respect to FIG. 3.

In some embodiments, building or receiving the computation circuit includes building or receiving an adder tree circuit, e.g., adder tree circuit 200T discussed above with respect to FIGS. 2 and 3 or adder tree circuit 400 discussed above with respect to FIG. 4.

At operation 640, via structures are formed electrically connecting bit lines of the DRAM array to a sense amplifier circuit of the computation circuit. Forming the via structures includes forming the via structures in a boundary layer between the first and second IC device layers, e.g., boundary layer CB between circuits C1 and C2 discussed above with respect to FIGS. 1A-1F.

In some embodiments, forming the via structures includes forming the via structures between the first and second semiconductor wafers and/or dies as part of the IC packaging process. Forming the via structures as part of the IC packaging process includes forming one or more dielectric layers including one or more electrically insulating materials, e.g., silicon dioxide ($SiO_2$), an epoxy, or an encapsulation material.

Forming the one or more dielectric layers includes performing one or more IC package manufacturing operations including one or more of a die separation process, a molding injection or deposition, a bonding process, an annealing process, or another process suitable for forming one or more dielectric layers as part of manufacturing an IC package.

Forming the via structures as part of the IC packaging process includes forming electrical connections in the one or more dielectric layers. Forming the electrical connections includes performing one or more manufacturing processes, e.g., a metal deposition process, a solder process, a bonding process, or another process suitable for forming electrical connections between semiconductor wafers and/or dies.

In some embodiments, forming the via structures includes forming the via structures between the first and second layers of the partially processed semiconductor wafer as part of manufacturing the partially processed semiconductor wafer.

Forming the via structures between the first and second layers includes performing a plurality of manufacturing operations including depositing and patterning one or more photoresist layers, performing one or more etching processes, and performing one or more deposition processes whereby one or more conductive materials are configured to form a continuous, low resistance structure spanning the first and second layers of the partially processed semiconductor wafer.

In some embodiments, forming the via structures includes forming TSV structures.

Electrically connecting the bit lines of the DRAM array to the sense amplifier circuit of the computation circuit includes forming the bit lines including the via structures. In some embodiments, electrically connecting the bit lines of the DRAM array to the sense amplifier circuit of the computation circuit includes electrically connecting bit lines B11-B1M and B21-B2M of DRAM array 100A to the sense amplifier circuit of computation circuit 100B discussed above with respect to FIGS. 1A-1F.

In some embodiments, electrically connecting the bit lines of the DRAM array to the sense amplifier circuit of the computation circuit includes electrically connecting bit lines B11-B1M and B21-B2M to sense amplifier circuit DSA of computation circuit 200 discussed above with respect to FIG. 2. In some embodiments, electrically connecting the bit lines of the DRAM array to the sense amplifier circuit of the computation circuit includes electrically connecting bit lines B11-B1M and B21-B2M to sense amplifier circuit ASA of computation circuit 300 discussed above with respect to FIG. 3.

At operation 650, in some embodiments, one or more additional manufacturing operations are performed. In some embodiments, performing the one or more additional manufacturing operations includes performing one or more IC packaging operations, e.g., a bonding, encapsulation, or injection operation. In some embodiments, performing the one or more additional manufacturing operations includes performing one or more semiconductor wafer processing operations, e.g., a deposition, etch, or planarization operation.

By performing some or all of the operations of method 600, an IC device is manufactured and configured as a memory circuit including a DRAM array positioned in a first circuit and a computation circuit positioned in a second circuit, thereby obtaining the benefits discussed above with respect to memory circuit 100.

In some embodiments, a memory circuit includes a first circuit including a DRAM array, wherein the DRAM array includes a plurality of bit lines, a second circuit including a computation circuit, wherein the computation circuit includes a sense amplifier circuit, and a boundary layer positioned between the first and second circuits, wherein the boundary layer includes a plurality of via structures configured to electrically connect the plurality of bit lines to the sense amplifier circuit. In some embodiments, the first circuit includes a first semiconductor die, the second circuit includes a second semiconductor die, and the plurality of via structures is positioned in one or more structural layers of an integrated circuit package including the first and second semiconductor dies. In some embodiments, the first circuit includes a first layer of a semiconductor die, the second circuit includes a second layer of the semiconductor die, and the plurality of via structures is positioned in a dielectric layer of the semiconductor die. In some embodiments, the sense amplifier circuit is configured to generate a plurality of digital signals based on a plurality of bit line signals on the plurality of bit lines, and the computation circuit includes a plurality of NOR gates configured to generate a plurality of output signals based on the plurality of digital signals and an input signal, and an adder tree configured to generate a summation data element based on the plurality of output signals. In some embodiments, the sense amplifier circuit is configured to generate a plurality of analog signals based on a plurality of bit line signals on the plurality of bit lines, and the computation circuit includes an ADC configured to, based on the plurality of analog signals and an input signal, perform one or more of a summation function, a scaling function, or a rectified linear unit function. In some embodiments, the computation circuit includes an adder tree configured to perform at least a portion of the summation function. In some embodiments, the DRAM array includes a plurality of DRAM cells coupled to the plurality of bit lines, and each DRAM cell of the plurality of DRAM cells includes a single transistor and a single capacitor. In some embodiments, the memory array includes a plurality of rows, each row of the plurality of rows includes a plurality of memory cells coupled to the plurality of bit lines, and the plurality of memory cells of each row of the plurality of rows is configured to store a plurality of weight data elements. In some embodiments, the memory circuit is configured to generate, sequentially by row, a plurality of signals on the plurality of bit lines based on the weight data elements.

In some embodiments, a neural network includes a first circuit, a second circuit, a boundary layer positioned between the first and second circuits, and a memory circuit including an array of DRAM cells positioned in the first circuit, a computation circuit positioned in the second circuit, wherein the computation circuit includes a sense amplifier circuit, and a plurality of bit lines coupled to each of the array of DRAM cells and the computation circuit, wherein each bit line of the plurality of bit lines includes a via structure positioned in the boundary layer. In some embodiments, the sense amplifier circuit is configured to receive a plurality of signals on the plurality of bit lines, the plurality of signals being based on weight data elements stored in the array of DRAM cells, and the computation circuit is configured to perform a matrix operation based on the plurality of signals and an input signal. In some embodiments, the sense amplifier circuit is configured to generate a plurality of digital signals based on the plurality of signals, and the computation circuit includes a plurality of NOR gates configured to generate a plurality of output signals based on the plurality of digital signals and the input signal, and an adder tree configured to generate a summation data element based on the plurality of output signals. In some embodiments, the sense amplifier circuit is configured to generate a plurality of analog signals based on the plurality of signals, and the computation circuit includes an ADC configured to, based on the plurality of analog signals and the input signal, perform one or more of a summation function, a scaling function, or a rectified linear unit function. In some embodiments, the neural network circuit is configured to perform the matrix operation by generating the plurality of signals by sequentially selecting rows of DRAM cells of the array of DRAM cells. In some embodiments, the first circuit includes a first semiconductor die, the second circuit includes a second semiconductor die, and the plurality of via structures are positioned in one or more structural layers of an integrated circuit package including the first and second semiconductor dies.

In some embodiments, a method of manufacturing an IC device includes building or receiving a DRAM array in a first IC device layer, building or receiving a computation circuit in a second IC device layer, and forming via structures electrically connecting bit lines of the DRAM array to a sense amplifier circuit of the computation circuit. In some embodiments, building or receiving the DRAM array in the first IC device layer includes receiving the DRAM array positioned in a first semiconductor wafer or die, and building or receiving the computation circuit in the second IC device layer includes receiving the computation circuit positioned in a second semiconductor wafer or die. In some embodiments, building or receiving the DRAM array in the first IC device layer includes building the DRAM array in a first layer of a partially processed semiconductor wafer, and building or receiving the computation circuit in the second IC device layer includes building the computation circuit in a second layer of the partially processed semiconductor wafer. In some embodiments, building or receiving the computation circuit includes building or receiving a plurality of NOR gates coupled to the sense amplifier circuit and an adder tree circuit. In some embodiments, building or receiving the computation circuit includes building or receiving an analog-to-digital-conversion circuit coupled to the sense amplifier circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a first circuit comprising a dynamic random-access memory (DRAM) array, wherein the DRAM array comprises a plurality of bit lines;
   a second circuit comprising a computation circuit, wherein the computation circuit comprises a sense amplifier circuit; and
   a boundary layer positioned between the first and second circuits,
   wherein
      the boundary layer comprises a plurality of via structures configured to electrically connect the plurality of bit lines to the sense amplifier circuit, and
      the plurality of bit lines electrically connected to the sense amplifier circuit by the plurality of via structures are an entirety of the bit lines electrically connected to the sense amplifier circuit.

2. The memory circuit of claim 1, wherein
   the first circuit comprises a first semiconductor die,
   the second circuit comprises a second semiconductor die, and
   the plurality of via structures is positioned in one or more structural layers of an integrated circuit package comprising the first and second semiconductor dies.

3. The memory circuit of claim 1, wherein
   the first circuit comprises a first layer of a semiconductor die,
   the second circuit comprises a second layer of the semiconductor die, and
   the plurality of via structures is positioned in a dielectric layer of the semiconductor die.

4. The memory circuit of claim 1, wherein
   the sense amplifier circuit is configured to generate a plurality of digital signals based on a plurality of bit line signals on the plurality of bit lines, and
   the computation circuit further comprises:
      a plurality of NOR gates configured to generate a plurality of output signals based on the plurality of digital signals and an input signal; and
      an adder tree configured to generate a summation data element based on the plurality of output signals.

5. The memory circuit of claim 1, wherein
   the sense amplifier circuit is configured to generate a plurality of analog signals based on a plurality of bit line signals on the plurality of bit lines, and
   the computation circuit comprises an analog-to-digital converter configured to, based on the plurality of analog signals and an input signal, perform one or more of a summation function, a scaling function, or a rectified linear unit function.

6. The memory circuit of claim 5, wherein the computation circuit further comprises an adder tree configured to perform at least a portion of the summation function.

7. The memory circuit of claim 1, wherein
   the DRAM array comprises a plurality of DRAM cells coupled to the plurality of bit lines, and
   each DRAM cell of the plurality of DRAM cells comprises a single transistor and a single capacitor.

8. The memory circuit of claim 1, wherein
   the memory array comprises a plurality of rows,
   each row of the plurality of rows comprises a plurality of memory cells coupled to the plurality of bit lines, and
   the plurality of memory cells of each row of the plurality of rows is configured to store a plurality of weight data elements.

9. The memory circuit of claim 8, wherein the memory circuit is configured to generate, sequentially by row, a plurality of signals on the plurality of bit lines based on the weight data elements.

10. A neural network circuit comprising:
    a first circuit;
    a second circuit;
    a boundary layer positioned between the first and second circuits; and
    a memory circuit comprising:
       an array of dynamic random-access memory (DRAM) cells positioned in the first circuit;
       a computation circuit positioned in the second circuit, wherein the computation circuit comprises a sense amplifier circuit; and
       a plurality of bit lines coupled to each of the array of DRAM cells and the computation circuit,
       wherein
          each bit line of the plurality of bit lines comprises a via structure positioned in the boundary layer, and
          the plurality of bit lines comprising the via structures positioned in the boundary layer are an entirety of the bit lines electrically connected to the sense amplifier circuit.

11. The neural network circuit of claim 10, wherein
    the sense amplifier circuit is configured to receive a plurality of signals on the plurality of bit lines, the plurality of signals being based on weight data elements stored in the array of DRAM cells, and
    the computation circuit is configured to perform a matrix operation based on the plurality of signals and an input signal.

12. The neural network circuit of claim 11, wherein
    the sense amplifier circuit is configured to generate a plurality of digital signals based on the plurality of signals, and
    the computation circuit further comprises:
       a plurality of NOR gates configured to generate a plurality of output signals based on the plurality of digital signals and the input signal; and
       an adder tree configured to generate a summation data element based on the plurality of output signals.

13. The neural network circuit of claim 11, wherein
    the sense amplifier circuit is configured to generate a plurality of analog signals based on the plurality of signals, and
    the computation circuit comprises an analog-to-digital converter configured to, based on the plurality of analog signals and the input signal, perform one or more of a summation function, a scaling function, or a rectified linear unit function.

14. The neural network circuit of claim 11, wherein the neural network circuit is configured to perform the matrix operation by generating the plurality of signals by sequentially selecting rows of DRAM cells of the array of DRAM cells.

15. The neural network circuit of claim 10, wherein
the first circuit comprises a first semiconductor die,
the second circuit comprises a second semiconductor die, and
the plurality of via structures are positioned in one or more structural layers of an integrated circuit package comprising the first and second semiconductor dies.

16. A method of manufacturing an integrated circuit (IC) device, the method comprising:
building or packaging a dynamic random-access memory (DRAM) array in a first IC device layer;
building or packaging a computation circuit in a second IC device layer; and
forming via structures electrically connecting bit lines of the DRAM array to a sense amplifier circuit of the computation circuit,
wherein the forming the via structures electrically connecting the bit lines of the DRAM array to the sense amplifier circuit comprises electrically connecting an entirety of the bit lines electrically connected to the sense amplifier circuit.

17. The method of claim 16, wherein
the building or packaging the DRAM array in the first IC device layer comprises packaging the DRAM array positioned in a first semiconductor wafer or die, and
the building or packaging the computation circuit in the second IC device layer comprises packaging the computation circuit positioned in a second semiconductor wafer or die.

18. The method of claim 16, wherein
the building or packaging the DRAM array in the first IC device layer comprises building the DRAM array in a first layer of a partially processed semiconductor wafer, and
the building or packaging the computation circuit in the second IC device layer comprises building the computation circuit in a second layer of the partially processed semiconductor wafer.

19. The method of claim 16, wherein the building or packaging the computation circuit comprises building or packaging a plurality of NOR gates coupled to the sense amplifier circuit and an adder tree circuit.

20. The method of claim 16, wherein the building or packaging the computation circuit comprises building or packaging an analog-to-digital-conversion circuit coupled to the sense amplifier circuit.

* * * * *